(12) United States Patent
Provenziani et al.

(10) Patent No.: US 11,871,546 B2
(45) Date of Patent: Jan. 9, 2024

(54) COOLING SYSTEM OF ELECTRONIC SYSTEMS, IN PARTICULAR FOR DATA CENTRE

(71) Applicant: WIELAND PROVIDES SRL, Latina (IT)

(72) Inventors: Franco Provenziani, Latina (IT); Filippo Cataldo, Latina (IT)

(73) Assignee: WIELAND PROVIDES SRL, Latina (IT)

(*) Notice: Subject to any disclaimer, the term of this patent is extended or adjusted under 35 U.S.C. 154(b) by 49 days.

(21) Appl. No.: 17/756,442

(22) PCT Filed: Dec. 4, 2020

(86) PCT No.: PCT/IB2020/061500
§ 371 (c)(1),
(2) Date: May 25, 2022

(87) PCT Pub. No.: WO2021/111387
PCT Pub. Date: Jun. 10, 2021

(65) Prior Publication Data
US 2023/0041910 A1    Feb. 9, 2023

(30) Foreign Application Priority Data

Dec. 5, 2019 (IT) .................. 102019000023076
Jan. 23, 2020 (IT) .................. 102020000001258

(51) Int. Cl.
*H05K 7/20* (2006.01)

(52) U.S. Cl.
CPC ..... *H05K 7/20809* (2013.01); *H05K 7/20245* (2013.01); *H05K 7/20254* (2013.01);
(Continued)

(58) Field of Classification Search
CPC .............. H05K 7/20245; H05K 7/208–20827
See application file for complete search history.

(56) References Cited

U.S. PATENT DOCUMENTS 7,077,189 B1 * 7/2006 Reyzin .................. H01L 23/473
165/83
10,156,873 B2 * 12/2018 Shelnutt ............. H05K 7/20809
(Continued)

FOREIGN PATENT DOCUMENTS

| EP | 1448040 A2 | 8/2004 |
| EP | 3324716 A2 | 5/2018 |
| JP | 2013065227 A | 4/2013 |

OTHER PUBLICATIONS

International Search Report and Written Opinion for Corresponding International Application No. PCT/IB2020/061500, 9 pages, dated Mar. 26, 2021.
(Continued)

Primary Examiner — Zachary Pape
(74) Attorney, Agent, or Firm — Lucas & Mercanti, LLP

(57) ABSTRACT

A cooling system for data centre, which data centre includes a plurality of servers associated to form a rack, each server being provided with one or more heat generating means. The system includes a plurality of first heat exchange circuits and second thermosyphon circuits. The overall configuration of the system being such that the second thermosyphon circuits are in fluid communication with each other according to a parallel connection.

18 Claims, 9 Drawing Sheets

(52) U.S. Cl.
CPC ..... *H05K 7/20309* (2013.01); *H05K 7/20318* (2013.01); *H05K 7/20336* (2013.01); *H05K 7/20645* (2013.01); *H05K 7/20772* (2013.01); *H05K 7/20818* (2013.01)

(56) References Cited

U.S. PATENT DOCUMENTS

| | | |
|---|---|---|
| 2003/0000721 A1 | 1/2003 | Garner |
| 2006/0146496 A1 | 7/2006 | Asfia |
| 2010/0328890 A1 | 12/2010 | Campbell |
| 2012/0180993 A1* | 7/2012 | Yoshikawa ........ H05K 7/20336 165/104.21 |
| 2020/0404805 A1* | 12/2020 | Gao .................. H05K 7/20781 |

OTHER PUBLICATIONS

International Preliminary Report on Patentability for Corresponding International Application No. PCT/IB2020/061500, 22 pages, dated Dec. 8, 2021.

\* cited by examiner

A - A

COOLING SYSTEM OF ELECTRONIC SYSTEMS, IN PARTICULAR FOR DATA CENTRE

CROSS-REFERENCE TO RELATED APPLICATIONS

This application is a 371 of PCT/IB2020/061500, filed Dec. 4, 2020, which claims the benefit of Italian Patent Application No. 102019000023076, filed Dec. 5, 2019 and Italian Patent Application No. 102020000001258, filed Jan. 23, 2020.

TECHNICAL FIELD OF THE INVENTION

The present invention relates to a cooling system, in particular for data processing centres or data centre and, generally, for cooling electronic components, that is heat-generating means.

BACKGROUND

The cooling of the electronic and informatic systems is of crucial importance for the effectiveness and the operation of the systems themselves. For example, the heat produced by the processing units (CPU and the like), can lead to overheat the several components up to produce temperature peaks which can invalidate the good operation of the electronic system under consideration.

The problem is particularly felt in the field of the data processing centres (DPC), or data centres, in which often there is a plurality of CPU and other heat generators approached therebetween.

In fact, the processing, the storing and the transfer of data and information has assumed a strategic importance in every field of industry and services, thanks to the growing evolution of the informatic technologies and the wide-scale diffusion of the Internet network. Following the huge amount of treated data, the data centres can have very relevant dimensions, until occupying whole rooms or whole buildings.

The data centres generally include a plurality of servers configured to manage data. Usually, a server includes a motherboard whereon the processing units (CPU) are placed. A commercial server generally consists of a motherboard with two CPUs, other low-consumption components and a stack of hard disks. The sizes and the type of electronic components vary based upon the server manufacturer, but the server overall sizes are generally standardized.

The servers usually are positioned one above the other one in a suitable frame so as to form a stack of servers, or otherwise called server rack, with the purpose of optimizing the spaces. A commonly known arrangement provides several server racks, placed side by side and spaced apart just enough to allow maintenance procedures or other interventions.

CPUs and generally servers are energy consuming and, in use, produce heat, reason why it is fundamental to provide cooling systems apt to control and manage temperatures.

In particular, it is necessary to avoid overheating which could damage the several server components, by jeopardizing the data centre operation.

In the state of art there are different solutions for the thermal management of the data centres, which provide the use of air as cooling fluid. Such solutions can be applied at different levels. Generally, the thermal management of a data centre is divided into five levels:

1) "chip" or CPU level;
2) "server" level;
3) "rack" level;
4) "plenum" level;
5) "room" level.

Further two levels can be added to these levels, relating to:

6) the possible air conditioning of the data centre room—"Computer Room Air Conditioning" (CRAC) level—and
7) the coolers, or chillers, used to produce cooling carrier fluid to be used to cool down the data centre components—"chiller" level.

Chip Level

CPUs, since they are high-power components of a motherboard, generate a significative thermal load which have to be suitably removed.

Analogous considerations can be made even for other heat-generating components, not necessarily used in the data-centres, for example motorized portions of motherboards or other electronic components which tend to overheat during operation.

Currently, a known solution provides the localized cooling of the heat-generating means by suitable heat exchange devices or cooling circuits applied on one or more heat-generating means. The operation of the devices or circuits is combined with the action of fans apt to force an air flow to pass through the device to subtract heat from the heat-generating means.

For example, for cooling the CPUs it is known to use a heat exchange device applied to the CPU itself and equipped with a series of fins made of aluminium incorporated on a copper plate and with a series of capillary tubes for conveying the heat. A group of fans, for example fixed onto the structure of a server, or however present near the heat-generating means, forces an air flow to pass through the fins. The thermal contact between the copper plate and the CPU is guaranteed by a thermal paste (the typical values of thermal conductivity are comprised between 7 W/mK and 12 W/mK). The CPU thermal load flows firstly on the thermal paste, then on the copper plate, on a capillary tube, on the aluminium fins and at last it is ejected in the airflow. Typically, the overall thermal resistance of such system varies from 0.7 K/W to 1 K/W when the CPU works near the thermal design power. These values can be reduced when the fans are forced to work at the maximum speed per minute (RPM), for example at 0.3 K/W, but with great energy expenditure and need for maintenance.

The causes of so low values of the thermal resistance are the air low thermal conductivity and the boiling limit of the capillary tubes.

Moreover, the use of fans in turn generates heat which has to be dissipated, by lowering the overall yield of the heat exchange device.

Another drawback linked to the cooling devices or traditional circuits is linked to the sizes of the same. In fact, the height of the known devices is relevant with respect to the thickness of a motherboard and this involves excessive overall dimensions resulting in a considerable available space reduction.

Another additional drawback is linked to the structural complexity and implementation of the known devices and circuits. Such complexity not only affects the implementation costs, but makes also more difficult possible maintenance procedures.

Server Level

The air flow required for cooling at chip level is provided by a group of fans, caged in the server structure. Generally, there are four to eight fans which operate parallelly, but there could be several groups of fans which operate in series depending upon the layout of the electronic components, the server height and the effectiveness of the heat sink. The heat sinks generally are closed by plastic cages with the purpose of directing the air flow on the fins and to avoid that the latter are bypassed.

The fans' speed generally is managed by an integrated software provided by the motherboards' manufacturers. The logic of such software is decided by a compromise between energy consumption of the fans, need for maintenance and CPU temperature.

The energy consumption of the fans, at full load, can vary from 50 to 200 W.

Rack Level

The thermal management at rack level, when the CPU cooling is performed through air flow, relates to the correct distribution and optimization of the air flow coming from the room and reaching the servers. Common solutions provide the modification of the rack structure and the optimization of the positioning of the servers inside the rack itself. Successful techniques for the thermal management at this level are linked to the entrance of air in the rack. In a data centre with raised floor, the air volume sucked by the server depends upon the pressure drop through the server and the fans' speed. There are other external parameters, such as holes on the rack front door, heat exchangers on the rack rear door and barriers due to the kit for managing cables imposing further pressure drops, which could influence substantially the air flow rate sucked by the servers.

When the air flow towards the server is not sufficient to cool down the chip, in the rack rear portion centrifugal air managers can be installed in order to suck more air from the front portion and to push it upwards, for example towards a return air plenum. This solution increases the energy consumption.

Plenum Level

Even the plenum design is of primary importance for the distribution of the air flow to the racks. A common solution is to have a plenum for the delivery air under the floor of the computer room and a plenum for the return air above the ceiling. An air flow can pass through the floor to reach then and cool down the racks. The air flow passing through the floor depends upon plenum planning parameters such as plenum depth, specifications of the floor tiles and partitions under the floor.

Therefore, it is essential to control the pressure distribution through the plenum.

Room Level

Nowadays, the most effective way to provide cold air from the plenum to the rows of racks is with a so-called "hot corridor/cold corridor" arrangement. The rows of racks are adequately spaced apart from one another to allow the optimal distribution of the cold air coming from the perforated tiles on the floor. In the corridors in which the perforated tiles are not present, air vents are provided on the ceiling to allow the hot air coming from the servers to reach CRAC (Computer Room Air Conditioning) units. This arrangement requires a careful planning of the distances between the rows of racks, the height of racks and the ceiling height.

CRAC Level

It is known to install air conditioners in the data centre rooms with the purpose of controlling temperatures. The computer room air conditioner (CRAC) for a data centre has to be planned with apparatuses of class A1 (stricter conditions allowed in the computer room as far as dry bulb temperature and relative humidity is concerned) to limit maintenance and to increase the life expectation of the electronic devices. Commonly, but even depending upon the position, a complete air handling unit (AHU) is required, suitable for winter and summer to keep the air flow in the computer room according to the limitations of class A1. AHUs consist of filters, blowers, heating and cooling coils, humidifiers and de-humidifiers and mixers. The strict control of the dry bulb temperature and the relative humidity increases the effective cooling load requested for the computer room.

Chiller Level

Typically, a group of refrigerators is positioned outside the computer room to provide cold water to the cooling coils of the CRAC units. The refrigerators can be of two types, depending upon the position of the data centre:

water-cooled refrigerator, in which the condenser is cooled on the side of water of cooling towers;

air-cooled condenser, in case the condenser is a coil cooled by the ventilators.

The coefficient of performance (COP) of a chiller strongly depends upon the evaporation temperature. The more is the evaporation temperature, the more is the COP.

In the known cooling systems high values of COP are not reached since the evaporation temperature has to be kept quite low, compatibly with the coils of the air-cooled condenser.

In conclusion, the technology for the air-cooling of electronic components and systems is well known and requires a low investment cost at chip and server level. However, it has drawbacks linked to the use of fans and other motorized components which require energy and which in turn produce heat to be disposed of.

Moreover, there are drawbacks to be managed at rack, plenum, room, CRAC and chiller level. In particular, the distribution of the air flow results to be critical, since a bad distribution of air can cause the decrease in the lifespan of the servers and increase the need for maintenance and the risk of failures.

At CRAC level, the fact of having the cooling load managed only by AHU increases the requested cooling load and, consequently, decreases the effectiveness therewith the heat is removed.

At chiller level, the inefficiencies of CRAC level reduce COP of chillers, by increasing the total energy consumption for cooling the computer room.

The known air-cooling systems, moreover, result to be complex to be implemented since they provide the assembly of multi-level mechanical and electronic components (ventilators, AHU units, chillers, room arrangement). The implementation complexity affects negatively even during the maintenance phase, often with need for interrupting the activities of the data centres.

SUMMARY OF THE INVENTION

The technical problem placed and solved by the present invention then is to provide a cooling system for data centre and generally electronic components allowing to obviate the drawbacks mentioned above with reference to the known art.

Such problem is solved by a cooling system according to claim 1.

Preferred features of the present invention are set forth in the depending claims.

The present invention provides some relevant advantages. The main advantage consists in that the cooling system results simple to be constructed and with high yield.

Based upon an aspect of the invention, the proposed system is used to cool down the CPUs of the servers in highly effective and passive way, even in case of much more powerful CPUs than the current ones.

Based upon an aspect of the invention, the system allows to cool a whole server rack through heat exchanges localized at the heat generating means and to avail of the principle of the thermosyphon.

The system provides, at level of the single server, a first heat exchange circuit, or primary circuit, comprising a heat exchange region coupled with the electronic components which generate heat and, at rack level, a secondary circuit, in particular constituted by a plurality of thermosyphon circuits fed parallelly, suitable for exchanging heat with the primary circuits of the respective servers. The secondary circuit is coupled with (each) primary circuit at said heat exchange region, that is at the heat-generating means.

According to a first embodiment, the primary circuit includes at least a thermosyphon circuit. Said thermosyphon circuit includes an evaporation portion coupled with the electronic component to be cooled down and a condensation portion overlapped to the evaporation portion and coupled with the secondary circuit.

According to a second embodiment, the primary circuit includes a device with pulsating oscillatory motion, otherwise called "pulsating heat pipe" device, which has reduced weight and production costs. Moreover, it can be easily modulated and adapted to different applications and then it is extremely versatile.

The pulsating heat pipe device is based upon the physical principle of the pulsating heat pipe, wherein a thermal carrier fluid under biphasic (liquid and vapour) condition is subjected to heating and cooling alternatively, by exploiting the expansion force of the vapour phase and the compression force of the liquid phase to trigger oscillatory motions inside thereof. Then, even the pulsating heat pipe device implements a passive cooling system, which does not require pump.

Moreover, based upon preferred embodiments the proposed cooling system requires a smaller height development since the force of gravity is not required for its operation.

In specific embodiments, other structural and thermal advantages are linked to plate-like elements used as heat exchange devices. Such plate-like elements, described in greater detail hereinafter in their specific embodiment examples, in fact, are cheap and highly effective and implement a micro-channel technology.

Other advantages, features and use modes of the present invention will result evident from the following detailed description of some embodiments, shown by way of example and not for limitative purposes.

BRIEF DESCRIPTION OF THE FIGURES

The figures of the enclosed drawings will be referred to, wherein.

The sizes of the above-mentioned figures are to be meant as purely exemplifying and not necessarily in proportion.

DETAILED DESCRIPTION OF PREFERRED EMBODIMENTS

Embodiments and variants of the invention will be described hereinafter, and this with reference to the above-mentioned figures.

Analogous components are designated in the several figures with the same, or a corresponding, numeral reference.

In the following detailed description, additional embodiments and variants with respect to embodiments and variants already treated in the same description will be illustrated limitedly to the differences with what already exposed.

Moreover, the several embodiments and variants described hereinafter are subjected to be used in combination, where compatible.

Figure 1:
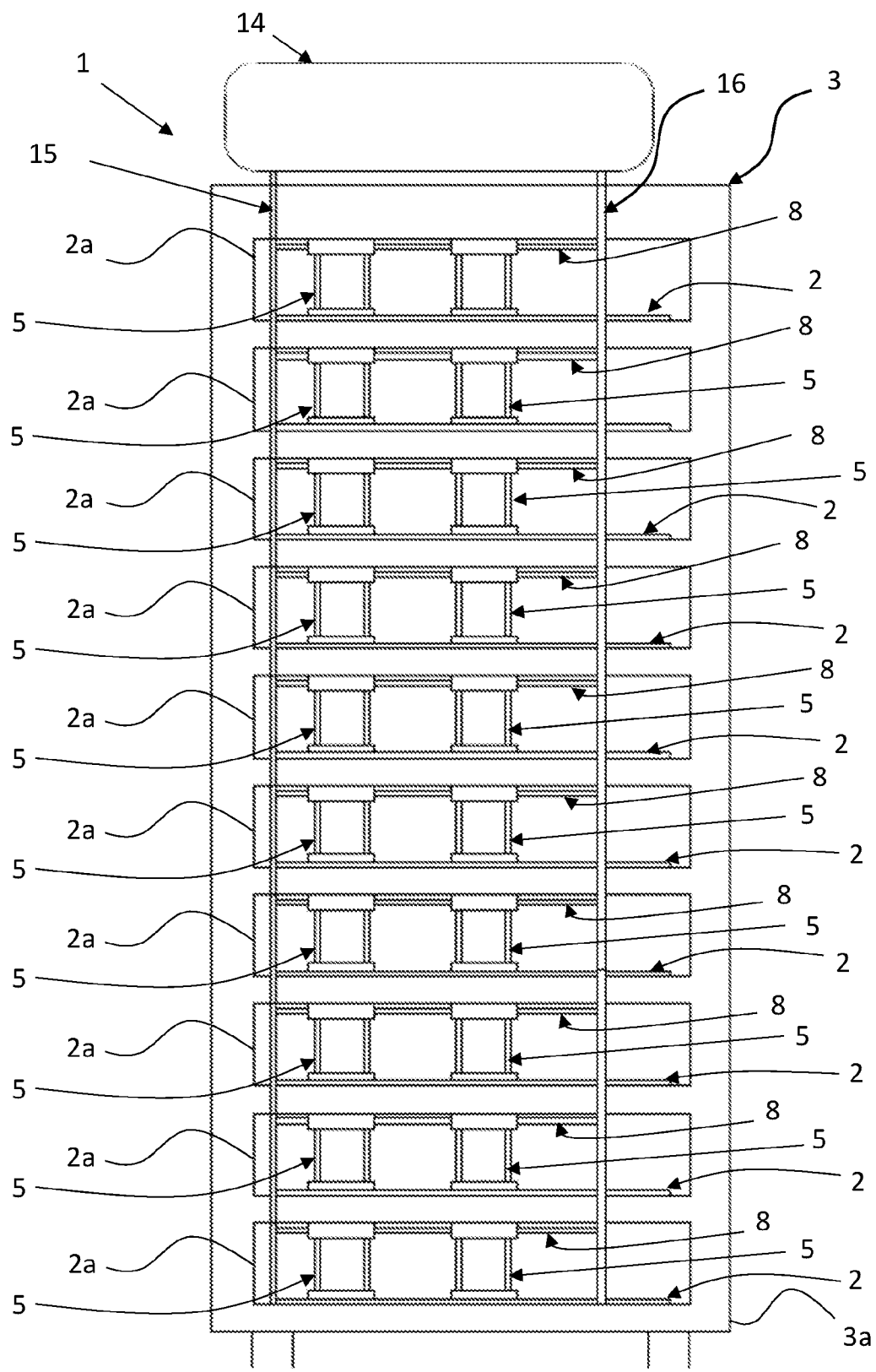
FIG. 1 shows a schematic side view of the cooling system according to the present invention and according to a first embodiment.

By firstly referring to FIG. 1, according to an embodiment of the invention a cooling system for a data processing centre, or data centre, is designated as a whole with 1.

The data centre includes a plurality of servers 2 associated to form a plurality of racks 3, the latter illustrated in simplified form in the figures. In the figures the racks 3 are illustrated with the servers 2 piled up vertically, but other alternative arrangements of the servers 2 are not excluded, for example wherein the servers 2 are arranged according to horizontal stacks, or according to stacks with tilted directions.

Usefully, each rack 3 can include a frame 3a wherein seats 2a are defined, configured to house the servers 2.

Each server 2 is equipped with heat-generating means 4, meant as components or sets of components which, in use, generate heat to be dissipated.

Figure 2:
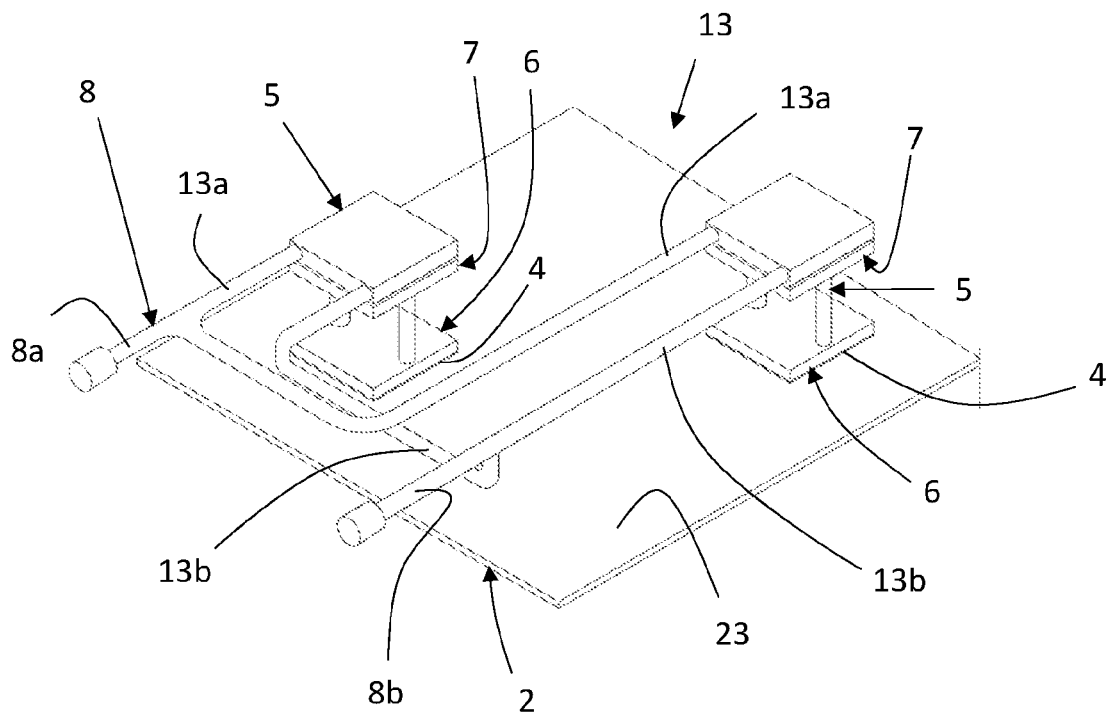
FIGS. 2-3 and 4 show respectively two axonometric views and a side section view of different details of the cooling system according to the first embodiment of the present invention.

Preferably, as illustrated in FIG. 2, each server 2 can include a motherboard 23 thereon the heat-generating means 4 is applied.

In particular, each server 2 is equipped with data processing units CPU which, in use, generate heat to be dissipated. The number of heat-generating means 4 varies depending upon the type of server. By way of example, the servers 2 illustrated in the figures include two CPUs 4, but solutions are not excluded wherein several CPUs 4 are present. The servers 2, moreover, can house several units, for example a rack unit (1U), or two rack units (2U), or more (3U, 4U and so on).

Moreover, solutions are not excluded wherein the servers 2 include even other heat-generating means 4, for example other hardware units different from the CPUs such as network cards, hard drive management cards, hard drive and continuity groups.

The system 1 advantageously includes at least a first heat exchange circuit, or primary circuit, designated with the reference 5 and comprising a heat exchange region placed at the heat-generating means 4. Said specific positioning allows an in-loco dissipation of the heat generated by the heat-generating means 4.

In the present discussion, the wording "first heat exchange circuit" or "primary circuit" includes any circuit, preferably closed circuit, inside which a first carrier fluid allows a heat exchange based upon a phase change thereof and/or through circulation (mini-thermosyphon) or oscillation (pulsating heat pipe) motions.

Inside the primary circuit, in use, a first thermal carrier fluid circulates.

For example, with reference to the embodiment illustrated in FIGS. 2-6 and FIG. 8, the first heat exchange circuit includes first thermosyphon circuits 5. Preferably, the numerosity of the first thermosyphon circuits 5 corresponds to the numerosity of the heat-generating means 4 provided by each server 2. Each first thermosyphon circuit is coupled with respective heat-generating means 4 at said heat exchange region.

Each primary circuit 5 is configured to allow circulation of a first thermal carrier fluid suitable for exchanging heat with heat-generating means 4.

The configuration is so that the first fluid subtracts heat from heat-generating means 4.

The consequent heat exchanges inside the primary circuit 5 cause phase changes which trigger inside thereof spontaneous convective motions of the first fluid.

Usefully, the system provides a primary circuit 5 for every heat-generating means 4, by allowing a local cooling of every heat-generating means 4.

The system 1 further includes a secondary circuit constituted by a plurality of second thermosyphon circuits 8, in particular in fluid communication therebetween and arranged according to a configuration in parallel therebetween.

Each second thermosyphon circuit 8 is associated to a respective server 2 of the above-mentioned plurality.

In particular, the above-mentioned second thermosyphon circuits 8 are thermally coupled with the primary circuits 5 at said heat exchange region which is placed at the heat-generating means 4.

More particularly, each one of the second thermosyphon circuits 8 is thermally coupled with the primary circuits 5 placed at a respective server 2.

Inside the second thermosyphon circuits, in use, a second thermal carrier fluid circulates, intended to exchange heat with the above-mentioned first working fluid.

Preferably, the second thermosyphon circuits 8 are in fluid communication with each other through a single delivery conduit 15 and a single return conduit 16. In this way, the second circuits 8 define an architecture with easy self-adjusting and simple construction, since they do not require a plurality of parallel delivery conduits and return conducts. In fact, the solution with a single delivery conduit 15 and a single return conduit 16, therefrom the thermosyphon circuits 8 branch out, minimizes the overall dimensions and, in the design phase, makes easier the sizing of the conduits themselves with the purpose of avoiding instability conditions of the working fluid.

As illustrated in the example of FIG. 1, the delivery conduit 15 and the return conduit 16 are arranged parallelly to one another and in substantially vertical positions.

The second carrier fluid flows at a substantially liquid state in the delivery conduit 15, by going down by gravity and branching out in each second thermosyphon circuit 8.

In the second thermosyphon circuits 8, the second carrier fluid heats up by subtracting heat from the primary circuits 5 and changes state going from a substantially liquid state to a substantially gaseous state.

The second thermosyphon circuits convey the second carrier fluid at the substantially gaseous state in the single return conduit 16 in which it goes back exiting from the rack 3.

In this way the principle of the thermosyphon is applied at rack level, the second carrier fluid flowing down by gravity and at the liquid state in the delivery conduit 15, it heats up in the second parallel thermosyphon circuits 8, and goes up at the gaseous state in the return conduit 16.

Usefully the second thermosyphon circuits 8 are configured to allow circulation of a second thermal carrier fluid suitable for exchanging heat with the first thermal carrier fluid.

The configuration is so that the second fluid subtracts heat from the first fluid circulating in the respective primary circuit 5.

The consequent heat exchanges inside the second thermosyphon circuit 8 cause phase changes which trigger inside the second circuit itself spontaneous convective motions of the second fluid.

As said, the system overall configuration 1 is so that the second thermosyphon circuits 8 are in fluid communication with each other according to a parallel connection.

The connection is so that the second fluid can circulate parallelly at each server 2, by subtracting heat from the fluid which circulates in the primary circuit 5.

In an advantageous embodiment, the second thermosyphon circuits 8 are arranged so that the vapour line outletting a corresponding server 2 results to be staggered with respect to the liquid line inletting the same server 2.

In other words, each server 2 is in fluid communication with said delivery conduit 15 at a lower height than the height in which said return conduit 16 is in fluid communication with the same server 2. Said height is considered with respect to the development directions of the delivery 15 and return 16 conduits with reference to a reference plane, like for example a resting plane of a respective server 2.

Advantageously, upon increasing the height difference between the inlet of the liquid line and the outlet of the vapour line outletting the same server 2, the maximum flow rate of the second carrier fluid crossing each server 2 increases.

In this way the cooling system 1 of the invention allows to dispose higher thermal loads, however by guaranteeing the overall stability of the system itself.

According to a preferred embodiment, at level of each server 2 it is possible to provide collector elements for distributing the second carrier fluid. Especially in case of multiple heat-generating means 4 in a same server 2, such solution allows a simplification in the architecture of the cooling system 1, with particular reference to the implementation of the second thermosyphon circuit 8.

Figure 8:
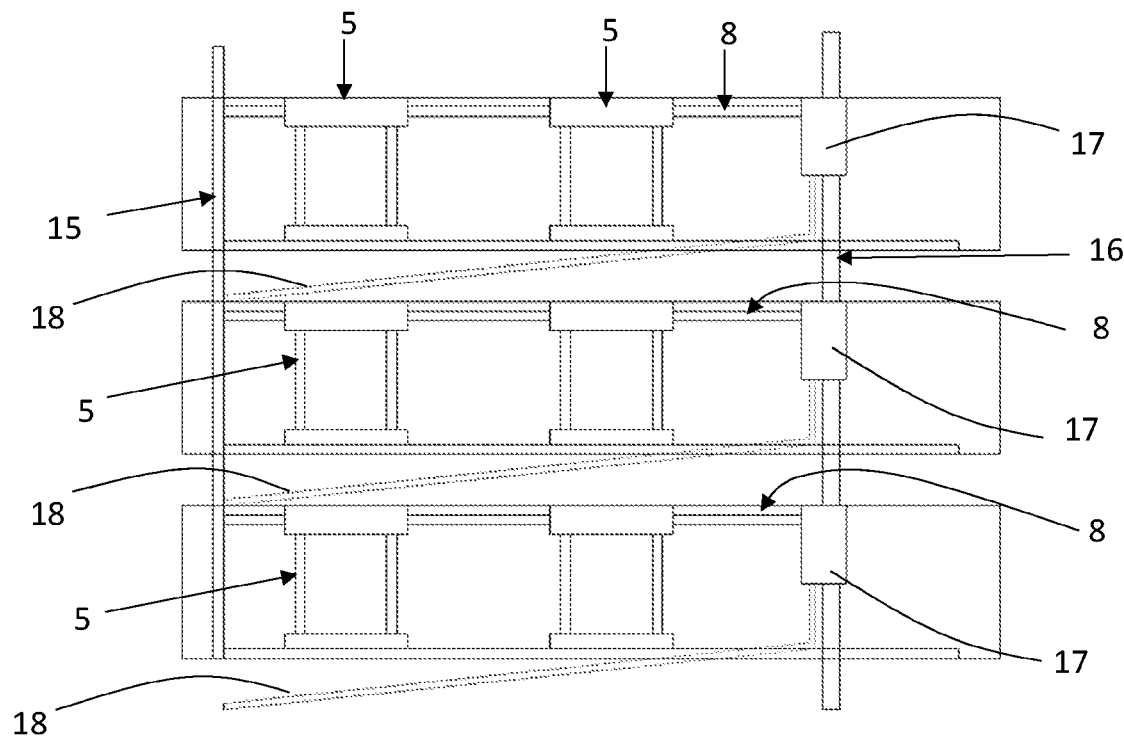
FIG. 8 shows a side schematic view of a preferred connection configuration of the cooling system, implemented in the first embodiment of the latter.
Figure 8A:
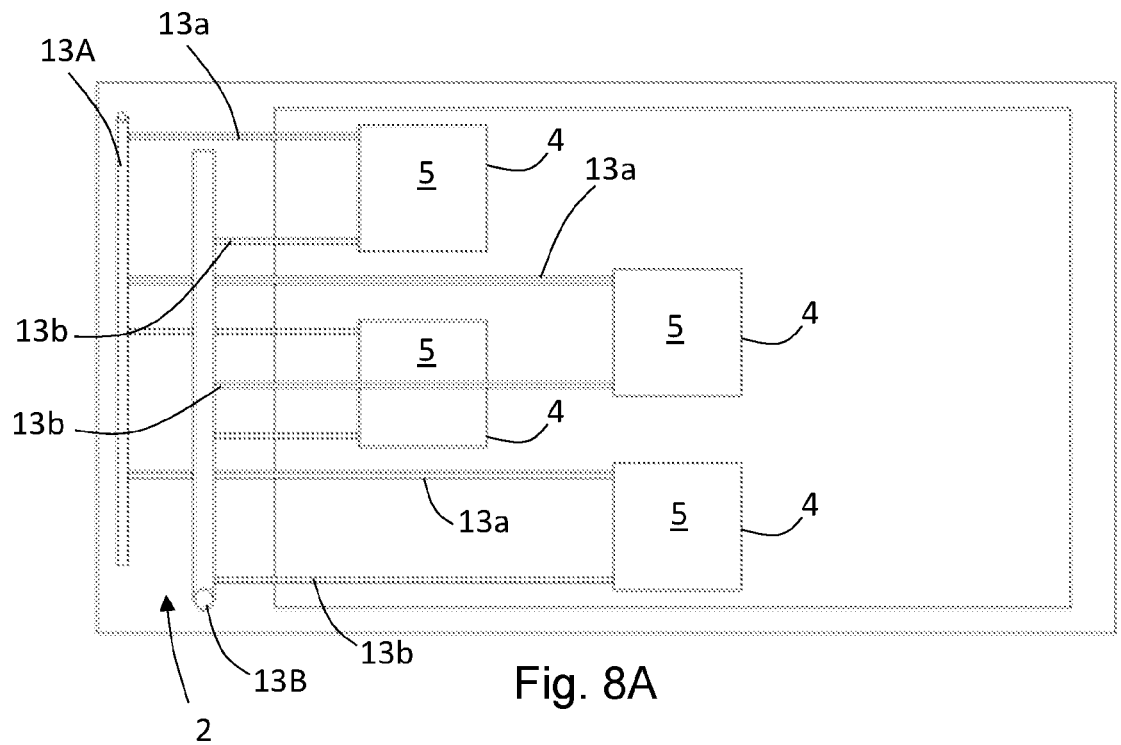
FIG. 8A shows a top schematic view of an additional preferred connection configuration of details of components of the cooling system according to the present invention.

With reference to FIG. 8A, it shows a top schematic view of a server level 2 and of the connection of the secondary circuit 8 with each one of the four primary circuits 5 associated to the corresponding heat-generating components 4 (hidden from the view in figure).

Advantageously, with the purpose of reducing the complexity and branches of the connections required to the second thermosyphon circuit 8 to reach each heat-generating component 4, the server 2 can have, or be associated to, a first collector 13A for the liquid line and a second collector 13B for the vapour line. As visible, from the first and second collector 13A, 13B as many respective connections 13a, 13b branch out as there are the primary circuits 5 which subtract heat from the heat-generating components 4.

The cooling system 1 according to the present invention then allows to apply the physical principle of the thermosyphon to several "heat exchange levels":
- at a local level, or "chip level", by means of a localized cooling of every heat-generating means 4 by means of a first heat exchange circuit, or primary circuit 5;
- at a "server" level, by means of a cooling of each server 2 by means of a respective second thermosyphon circuit 8 which subtracts heat from the first carrier fluids of each primary circuit 5 existing at the heat-generating means 4 of the same server.
- at a "rack" level, by means of the parallel connection of the second circuits 8 allowing to bring the heat subtracted from the first carrier fluids, by means of parallel circulation of the second fluid in the several servers 2, outletting from the rack 3.

The functional and structural aspects of one or more embodiments of the present invention, are described hereinafter. For an easier comprehension, the invention is described hereinafter in relation to the several "heat exchange levels".

A first embodiment of the cooling system 1, illustrated schematically in FIGS. 1 to 6, will be now described.

Chip Level

The "chip level" refers to the heat exchange "localized" at the single heat-generating means 4.

According to a first embodiment of the cooling system 1, the primary circuit includes a thermosyphon circuit 5 for every heat-generating means 4.

Preferably, the first carrier fluid can be selected among the following refrigerant fluids, the abbreviations thereof refer to the International standard Nr.34 ASHRAE: R1234ze(E), R1233zd(E), R1234yf. These are particularly useful for the thermal properties, for the saturation pressures and for the low Global Warming Potential (GWP). Refrigerant fluids having properties analogous to those of the above-mentioned fluids are not excluded.

Figure 3:
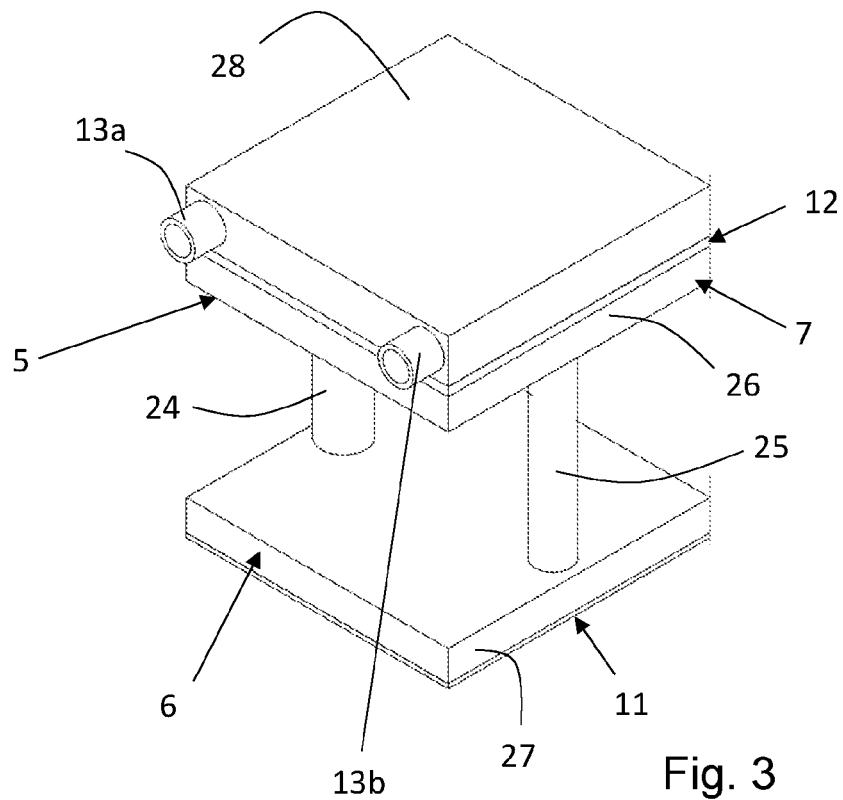
Figure 4:
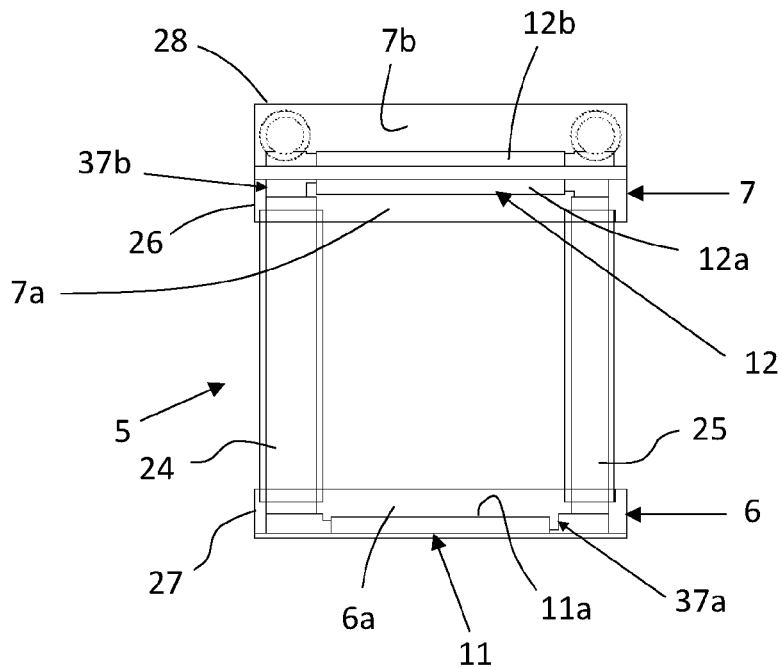

With reference to FIGS. 2-4, usefully, each one of the first thermosyphon circuits 5 can be of the type of a device comprising an evaporation portion 6 which can be placed thermally in contact with the respective heat-generating means 4, and a condensation portion 7 placed thermally coupled to one or more of the second thermosyphon circuits 8, or with another external system. Preferably, the evaporation portion 6 and the condensation portion 7 are implemented each one in one single piece.

The evaporation portion and the condensation portion implement the above-mentioned heat exchange region.

Thermal interface material, or other elements, is not necessary to allow the removal thereof.

Preferably, each first thermosyphon 5 can have an evaporation portion 6 and a condensation portion 7. This solution prevents that an instability in the second thermosyphon circuit 8 occurs, by guaranteeing and improving the cooling performances of the first thermosyphon circuit 5.

Figure 5:
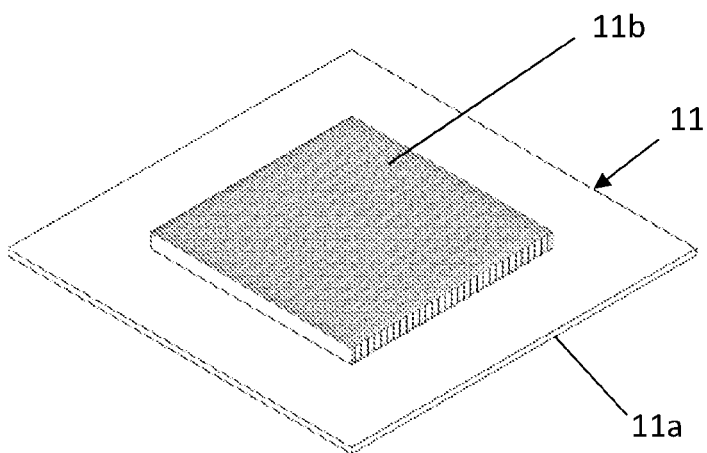
FIGS. 5 and 6 show respectively an overall view and a side section view of an additional detail of a preferred variant of the first embodiment of the present invention.
Figure 6:
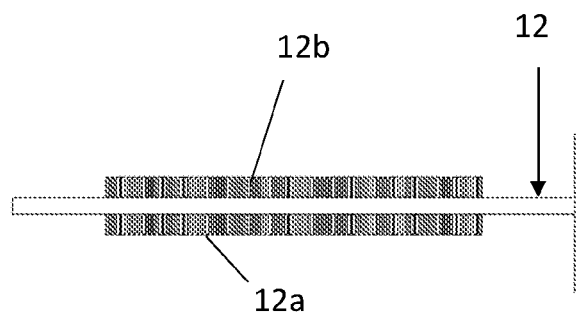

With particular reference to FIGS. 5 and 6, the evaporation portion 6 and the condensation portion 7 can include heat exchange means 11b, 12a, 12b.

In particular, the evaporation portion 6 and the condensation portion 7 include a respective plate-like element 11, 12 equipped with heat exchange means.

Advantageously, the heat exchange means 11b, 12a, 12b can include a plurality of finned elements 11b, 12a, 12b defining crossing channels, or otherwise called "microchannels", for the first and/or the second thermal carrier fluid.

The microchannels can be designed so as to optimize both the heat transfer coefficient and the pressure drops of the carrier fluid and to avoid the occurrence of stopping bubbles. Usefully, the process for manufacturing the microchannels can provide milling and cutting procedures from a starting element with a numerical control machine.

Preferably, the plate-like elements 11, 12 can be made of copper, since it has a high thermal conductivity. Alternative solutions are not excluded, for example wherein the whole first thermosyphon circuit 5 is made of aluminium.

With reference to the embodiment illustrated in FIGS. 3, 4, 5 and 6, the evaporation portion 6 includes a plate-like element 11 placed in thermal contact with heat-generating means 4. The plate-like element 11, then, has the function of cooling the heat-generating means 4, for this reason it can be designated as "cold plate".

Usefully, the thermal contact between the plate-like element 11 and heat-generating means 4 can be implemented by means of a thermal paste or other thermal interface materials (TIM). The thermal paste can be interposed between the cold plate 11 and the heat-generating means 4 and it is suitable to favour the heat exchange between the two of them.

Advantageously, a thermal paste having thermal conductivity equal or higher than 12.5 W/mK can be used.

Usefully, the evaporation portion 6 can include a cover-like element 27 associated to said plate-like element 11 to define an evaporation volume 6a wherein the first carrier fluid can exchange heat going from a substantially liquid phase to a substantially gaseous phase. The configuration can be so that the cover-like element 27 and the plate-like element 11 can define an evaporation volume 6a. The condensation portion 7 can include a plate-like element 12 equipped with finned elements 12a on one side and, on the opposite side, with finned elements 12b. The finned elements 12a define microchannels which can be crossed by the first carrier fluid to give heat. On the contrary, the finned elements 12b define microchannels which are thermally in contact with the finned elements 12a and which can be crossed by the second carrier fluid, the latter acquiring the heat ceased by the first carrier fluid.

In particular, the condensation portion 7 can include a second cover-like element 26 associated to the plate-like element 12 to define a condensation volume 7a wherein the first carrier fluid can further exchange heat going from a substantially gaseous phase to a substantially liquid phase. The finned elements 12a of the plate-like element 12 are included in the condensation volume 7a. The configuration can be so that the cover-like element 26 and the plate-like element 12 can define a condensation volume 7a.

Inside the evaporation volume 7a and/or the volume 6a at least an element 37a, 37b for distributing the fluid can be inserted inside the respective covers 26, 27. The distribution element 37a, 37b is suitably configured to optimize the distribution of the fluid circulating inside the respective covers 26, 27.

Advantageously, the first thermosyphon circuit 5 can include a delivery channel 25 and a return channel 24 connecting the evaporation portion 6 and the condensation portion 7.

Solutions are not excluded wherein there is a different number of delivery channels 25 and a return channel 24, depending upon the type of used fluid and the thermal load of the heat generator.

Usefully, the channels 24, 25 can be arranged vertically, parallelly to one another.

Preferably, in the evaporation volume 6a, a first distributor element 37a can be interposed between the delivery channel 25 and the finned elements 11a. The distributor element 37a is configured so as to reduce the passage available for the fluid outletting the delivery channel 25 before entering the finned elements 11a.

In the condensation volume 7a, a second distributor element 37b can be interposed between the return channel 24 and the finned elements 12a. The distributor element 37b is configured so as to reduce the passage available for the fluid outletting the return channel 2a before entering the finned elements 12a.

The distribution elements 37a, 37b, then, allow to adjust the flow of the first carrier fluid.

The distribution elements 37a, 37b are configured so as to reduce the passage of the fluid respectively outletting the delivery channel 25 and the return channel 24.

The first carrier fluid at the liquid state can flow by gravity from the condensation portion 7 to the evaporation portion 6.

Upon entering the evaporation portion 6, in particular the evaporation volume 6a, the first carrier fluid crosses the microchannels defined by the finned elements 11a on the first plate-like element, thereat it subtracts heat from the heat-generating means 4.

By heating up, the first carrier fluid evaporates and goes back through the return channel 24 by reaching the condensation portion 7.

In the condensation portion 7, in particular in the condensation volume 7a, the first carrier fluid crosses the microchannels defined by the finned elements 12a, by giving heat and going back to a substantially liquid state.

According to the present embodiment, the condensation portion 7 includes a cover-like element 28 associated to the plate-like element 12 to define a second evaporation volume 7b configured to house, at least partially, the finned elements 12b of the plate-like element 12. The second evaporation volume 7b is separated from the condensation volume 7a by means of the plate-like element 12. Inside the second evaporation volume 7b the second carrier fluid can be conveyed so that the latter can exchange heat with the finned elements 12b. In particular, the finned elements 12b, heated by the first carrier fluid by means of the finned elements 12a, give heat to the second carrier fluid.

Server Level

The "server level" refers to the heat exchange which takes place at each server 2.

As already written above, the system 1 includes a plurality of second circuits 8 each one configured to subtract heat from a respective server 2 by means of the flowing of a second thermal carrier fluid.

Preferably, the second carrier fluid can be selected among the following refrigerant fluids, the abbreviations thereof make reference to the International standard Nr. 34 ASHRAE: R1234ze(E), R1233zd(E), R1234yf. These are particularly useful for the thermal properties, for the saturation pressures and the low Global Warming Potential (GWP). Refrigerant fluids having properties analogous to those of the above-mentioned ones are not excluded.

For each server 2 there is a second circuit 8 thermally coupled at the first thermosyphon circuits 5 which, in turn, are thermally coupled at the heat-generating means 4 of the same server 2.

In general terms, the configuration is so that the heat exchange and the physical coupling between a second thermosyphon circuit 8 and the primary circuit 5 is at the heat-generating means 4.

In the now described example, the heat exchange between the second thermosyphon circuit 8 and the first thermosyphon circuit 5 takes place at the first thermosyphon circuit itself and, then, at the heat-generating means 4.

Going back to FIGS. 1, 2, advantageously the second thermosyphon circuits 8 include connecting means 13 configured to implement a thermal coupling in series and/or in parallel with the respective first thermosyphon circuits 5.

With reference to the embodiment of FIG. 2, the connecting means 13 includes first feeding tubes 13a apt to convey the second carrier fluid inletting the first thermosyphon circuits 5, and second feeding tubes 13b apt to convey the second carrier fluid outletting the first thermosyphon circuits 5.

In the embodiment of FIG. 2, the connecting means 13 implements a parallel thermal coupling of the second thermosyphon circuit 8 with the first thermosyphon circuits 5.

Usefully, the first feeding tubes 13a branch out from a single delivery pipe 8a and enter the second evaporation portion 7 of the first thermosyphon circuit 5.

On the contrary, the second feeding tubes 13b outgo from the second evaporation portion 7 of the first thermosyphon circuit 5 and connect in one single return pipe 8b intended to outgo from the server 2.

Such configuration allows the system 1 to convey, in a single determined server 2, the second carrier fluid at the same temperature in each first thermosyphon circuit 5 existing in the server itself.

Alternative solutions are not excluded wherein the connecting means 13 includes first tubes 13a and second tubes 13b connected in series.

In such case, the second tube 13b of a determined first thermosyphon circuit 5 can coincide with the first tube 13a of the first thermosyphon circuit 5 which precedes it.

In series and parallel mixed solutions, in case of several first thermosyphon circuits 5, also are not excluded.

It is also possible to provide collecting elements of the second operating fluid, as previously described with reference to FIG. 8A.

The above-described examples make reference to a server 2 having two heat-generating means 4, but the same considerations can be made even for embodiments which provide servers 2 with a different number of heat-generating means 4, for example four-CPU servers.

In each case, since the cooling of the heat-generating means 4 is performed directly at "chip" level, advantageously by means of a plate-like element 11 which is a micro-channel heat exchanger, there is no the need for a particular design of inlet holes for the air flow, or the optimization of the air flow pressure drop, or the layout of the electronic components, and a control logic for the fans' speed. The system 1, then, results to have a simple construction even at "server level".

Rack Level

The "rack level" refers to the heat exchange allowing to remove the heat produced by the heat-generating means 4 from the rack 3.

Again, with reference to FIG. 1, as already anticipated above, the system overall configuration provides that the second circuits 8 are connected in parallel so that the second carrier fluid succeeds in subtracting heat parallelly from each server 2.

Preferably, the system 1 includes a condensation unit 14 connected to the delivery conduit 15 and to the return conduit 16.

The condensation unit 14 is configured to subtract heat from the second carrier fluid, by cooling it and bringing it back to a substantially liquid state.

Usefully, the condensation unit is placed outside the rack 3, preferably above it so as to feed the second circuits 8 by gravity.

According to a possible embodiment, the condensation unit 14 can be of the type of a shell-and-tube heat exchanger wherein a third carrier fluid subtracts heat from the second carrier fluid. In this way, the whole thermal load is brought outside the rack 3 and given to the third carrier fluid.

Different solutions are not excluded, for example wherein, depending upon the thermal load of the rack, of the overall dimensions, or of the supply preferences, the condensation unit 14 is of the type of a plate exchanger, a micro-channel exchanger, or of another known type.

Usefully, the third carrier fluid can be water, but other carrier fluids are not excluded, for example the air of the surrounding environment or other thermal carrier fluids.

A first embodiment of the cooling system 1 will be now described, illustrated schematically in FIGS. 9 to 17.

According to such variant, the cooling system 1 allows to apply both the physical principle of the thermosyphon, and the physical principle of the pulsating heat pipe or otherwise called "pulsating heat pipe".

In the pulsating heat pipe, a thermal carrier fluid under biphasic (liquid and vapour) condition is subjected to heating and cooling alternatively, by exploiting the expansion force of the vapour phase and the compression force of the liquid phase in order to trigger oscillatory motions inside thereof. As in the principle of the thermosyphon, then, the pulsating heat pipe implements a cooling passive system which does not require pump, but differently from the principle of the thermosyphon requires a less height development since the force of gravity is not required for its operation.

In the second embodiment, the principle of the pulsating heat pipe was applied at "chip level", whereas in the other levels ("server level" and "rack level") the principle of the thermosyphon was applied with modes and features analogous to those already described previously in the first embodiment.

The second embodiment will be then described hereinafter only with reference to the heat exchange level called "chip level".

In particular, the first heat exchange circuit, or primary circuit, designated with the reference 5 will be described which, in this second embodiment, is of the type of a device configured to implement the physical principle of the pulsating heat pipe or otherwise called "pulsating heat pipe". As already said above, in the pulsating heat pipe, a thermal carrier fluid under biphasic (liquid and vapour) condition is subjected to heating and cooling alternatively, by exploiting the expansion force of the vapour phase and the compression force of the liquid phase in order to trigger oscillatory motions inside thereof. The device implements a cooling passive system which does not require pump and does not require a height development since the force of gravity is not required for its operation.

Even in this case, the device provides an evaporation portion 6 and a condensation portion 7 coupled therebetween in a single monolithic component. Thermal interface material, or other elements, is not required to allow the removal thereof.

The evaporation portion and the condensation portion implement the above-mentioned heat exchange region.

Advantageously, each primary circuit 5 includes an evaporation portion 6 and a condensation portion 7. This solution implements the effectiveness of heat exchange between the second thermosyphon circuit 8 and the primary circuit 5, by improving the cooling performances of the latter.

The system 1 provides a pulsating heat-based heat exchange circuit 5 for every heat-generating means 4. In the second embodiment (FIGS. 9 and 10), the configuration of the pulsating heat-based heat exchange circuit 5 is so that a first biphasic carrier fluid can be subjected alternatively to heating and cooling, with consequent phase exchange from liquid to vapour and vice versa. Inside the pulsating heat-based heat exchange circuit 5, then, oscillatory motions of the fluid are triggered due to the effect of the action of the expansion and compression forces due to the vapour/liquid phase change.

Preferably, the first carrier fluid can be selected among the following refrigerant fluids the abbreviations thereof refer to the International standard Nr.34 ASHRAE: R1234ze(E), R1233zd(E), R1234yf. These are particularly useful for the thermal properties, for the saturation pressures and for the low Global Warming Potential (GWP). Refrigerant fluids having properties analogous to those of the above-mentioned fluids are not excluded.

Figure 9:
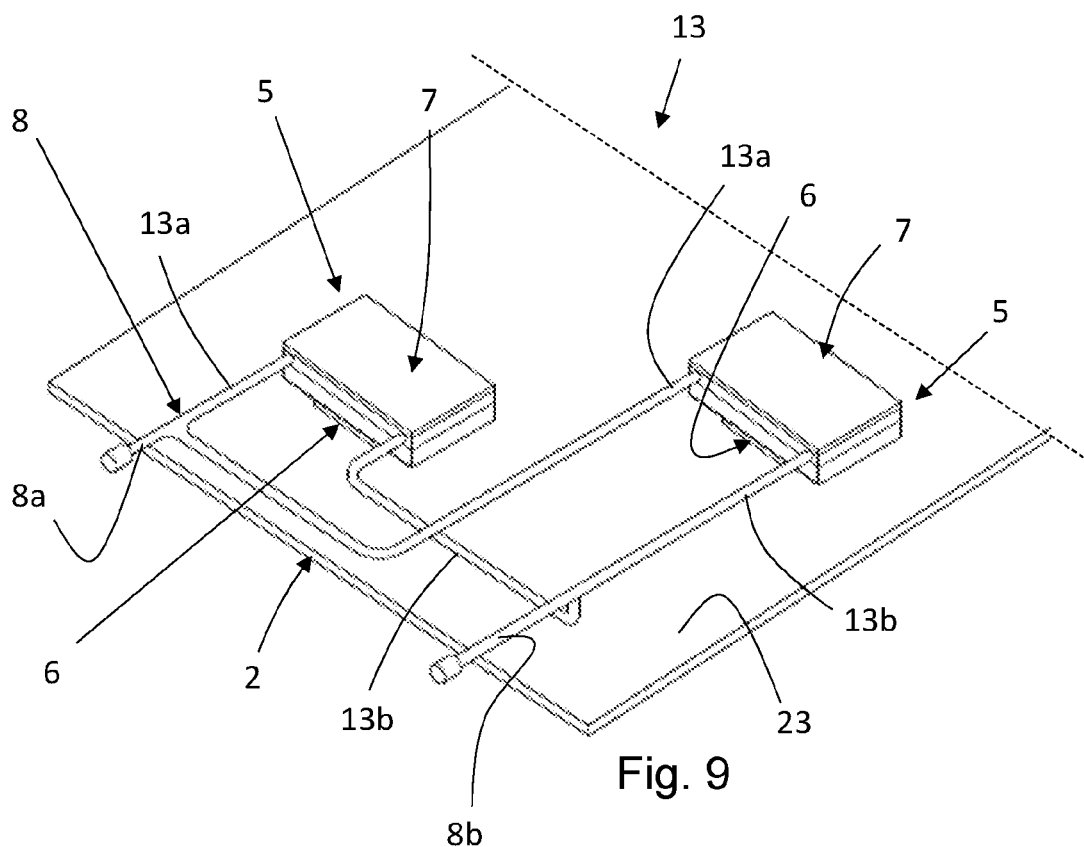
FIGS. 9 and 10 show axonometric views of different details of the cooling system according to a second embodiment of the present invention.
Figure 10:
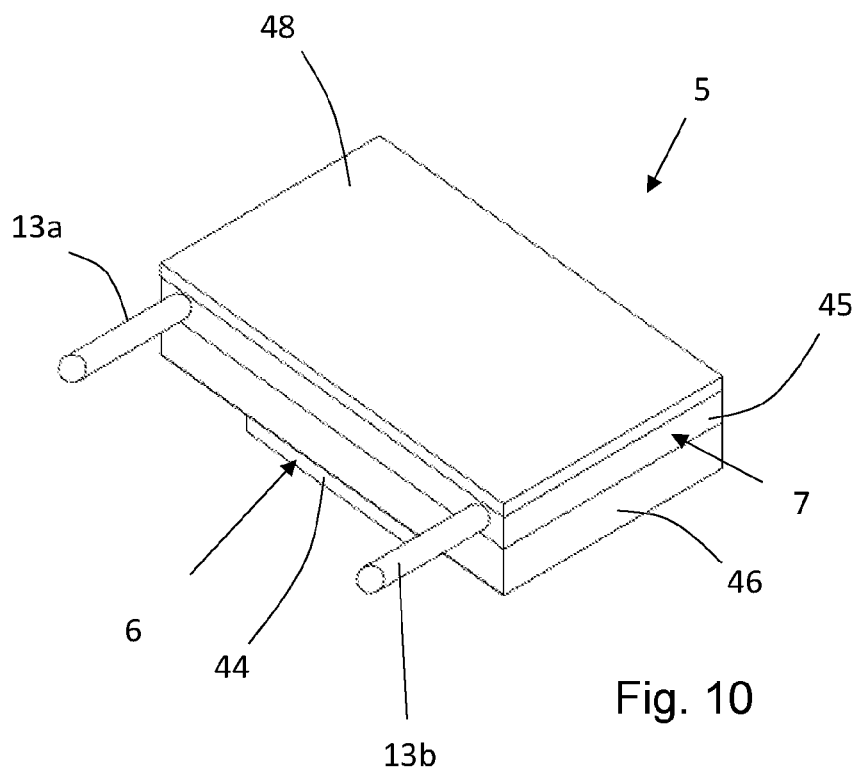

Even in the second embodiment, each one of the pulsating heat-based heat exchange circuits 5 includes an evaporation portion 6 placed thermally in contact with the respective heat-generating means 4, and a condensation portion 7 placed thermally in contact with one or more second thermosyphon circuits 8. In FIG. 9 the heat-generating means 4 is not visible, but it is placed below the evaporation portion 6. In this possible use form, the two devices 1 are associated to a second circuit 8 in which a second carrier fluid can flow to subtract heat from the first carrier fluid. In particular, the two devices 1 are associated to the second circuit 8 by means of a parallel connection. Each device is associated to a first feeding tube 13a, therethrough the second carrier fluid can enter, and to a second feeding tube 13b, therethrough the second carrier fluid can go out.

The evaporation portion 6 and the condensation portion 7 are overlapped therebetween to define the pulsating heat-based heat exchange circuit 5 or pulsating heat-based heat exchange device.

With reference to FIGS. 12-15, advantageously, the pulsating heat-based heat exchange device includes circulating means 50 of a first biphasic carrier fluid suitable for exchanging heat with one or more heat-generating means 4.

The circulating means 50 is configured to allow the first carrier fluid to circulate with pulsating oscillatory motion from the evaporation portion 6 to the condensation portion 7 and vice versa.

Usefully, the circulating means 50 is associated to the evaporation portion 6 and to the condensation portion 7 and configured to allow the first carrier fluid to exchange heat.

In particular, the circulating means 50 comprises a coil element wherein the first carrier fluid can flow. The configuration of the coil element 50 is so that the capillary phenomena acting on the circulating carrier fluid prevail on the force of gravity.

Usefully, the coil element 50 has a continuous development according to a curvilinear path which goes alternatively from the evaporation portion 6 to the condensation portion 7 and closes on itself.

The configuration is so that the first carrier fluid circulates with pulsating oscillatory motion from the evaporation portion 6 to the condensation portion 7 and vice versa.

The coil element 50 includes first portions 50a positioned at the condensation portion 6 and second portions 50b positioned at the evaporation portion 7. The first portions 50a are placed in fluid communication with the second portions 50b.

When the first fluid is in a first portion 50a it absorbs heat by means of the evaporation portion 6, by cooling the heat-generating means 4. The absorbed heat induces a phase change in the first carrier fluid which goes from a substantially liquid state to a substantially gaseous state. The expansion force consequent to the state change pushes the first carrier fluid towards a respective second portion 50b.

Vice versa, when the first fluid is in a second portion 50b it gives heat to the second carrier fluid by means of the condensation portion 7. Upon giving heat, the first carrier fluid changes state going from a substantially gaseous state to a substantially liquid state. The compression force consequent to the change of state pushes the first carrier fluid towards a respective first portion 50a.

By combining the expansion force and the compression force due to the fluid change of state with the capillarity of the coil element 50 a pulsating oscillatory motion of the first fluid inside the coil element 50 itself is obtained, therefore the use of pumps or other motion elements is not required. Thanks to the pulsating oscillatory motion of the first carrier fluid, the heat is subtracted from the heat-generating means 4 and transferred to an external system, for example to a second carrier fluid.

Advantageously, the coil element 50 can have a circular, or squared, or rectangular cross section, but other compatible forms, for example ellipsoidal, ovoidal, trapezoidal forms or the like, are not excluded.

The equivalent diameter of the section of the coil element 50 has to be small enough to confine the vapour bubbles of the biphasic fluid, that is to prevent the stratification of the liquid in the low portion of the channel and of the vapour in the high portion.

Here it is highlighted that under "equivalent diameter" of the cross section of the coil element 50 the diameter of a hypothetical circular section having same geometrical, fluid-dynamic, optical and electric behaviour of the same cross section is meant.

In order to dimension the coil channel, reference can be made to the dimensionless numbers known as "Bond number" or "Confinement number": the diameter of the coil channel has to be lower than or equal to the size obtained by the above-mentioned dimensionless numbers.

Usefully, by making reference to the above-mentioned refrigerant fluids, the equivalent diameter of the cross section of the coil element 50 can be lower than 2 millimetres.

Advantageously, the equivalent diameter of the cross section of the coil element 50 can be between 0.5 mm and 1 mm. In fact, these are optimum values of compromise between effectiveness and production costs.

The coil element 50 can have cross section with constant equivalent diameter along its entire curvilinear path. The alternative solution is not excluded wherein the coil element 50 can have narrowing or increases in section along the curvilinear path, the equivalent diameter being able to vary from a cross section to the other one.

Usefully, the coil element 50 can be implemented by winding a capillary tube in a determined number of folds, or by obtaining by milling and extrusion one or more channels from a starting element, for example a plate or block made of copper or aluminium, with a numerical control machine.

Preferably, the evaporation portion 6 can include a first plate-like element 44 configured to be placed in contact with respective heat-generating means 4.

In the first plate-like element 44 the portions 50a of the coil element 50 are obtained. In this way, the first carrier fluid can subtract heat from the heat-generating means 4.

The first plate-like element 44, then, has the function of cooling the heat-generating means 4, for this it can be designated as "cold plate".

Figure 13:
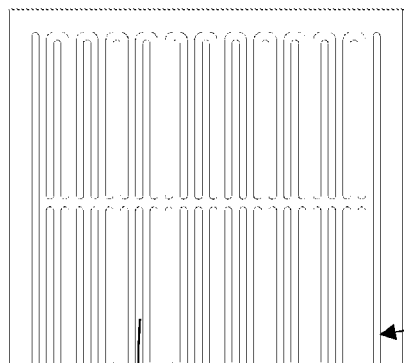
FIGS. 13 to 16 show planar section views of components of the detail shown in FIG. 10 according to preferred structural variants.

A horizontal section of the plate-like element 44 is illustrated in FIG. 13.

Usefully, the thermal contact between the first plate-like element 44 and the heat-generating means 4 can be implemented by means of a thermal paste or other thermal interface material (TIM). The thermal paste can be interposed between the cold plate 44 and the heat-generating means 4 and it is suitable to favour the heat exchange between the two of them.

Advantageously, a thermal paste can be used having thermal conductivity equal or higher than 12.5 W/mK.

Advantageously, the condensation portion 7 can include a second plate-like element 45 configured so that the first carrier fluid, into it, can give heat. In particular, the second plate-like element 45 is configured so as to allow a heat exchange between the first carrier fluid and a system thermally coupled to the device, for example between the first carrier fluid and a second carrier fluid without they come in direct contact. In the FIGS. 15 and 16 preferably horizontal cross sections of the second plate-like element 45 are illustrated.

The portions 50b of the coil element 50 are obtained in the second plate-like element 45.

Figure 16:
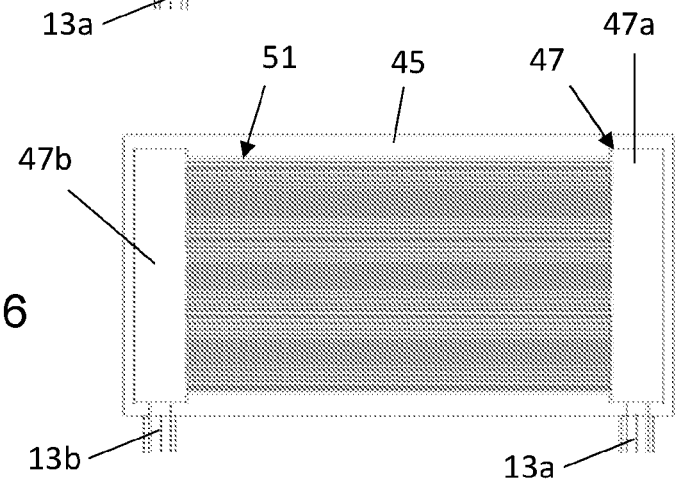

With reference to FIG. 16, the second plate-like element 45 preferably can include a circulation area 47 in which a second carrier fluid can circulate, for example a second carrier fluid of a circuit thermally coupled to the device.

The circulation area 47 can include at least two distribution areas 47a, 47b configured to distribute respectively the second fluid inletting/outletting the condensation portion 7.

The distribution areas 47a, 47b can be in fluid communication respectively with a first feeding tube 13a and a second feeding tube 13b. The latter, for example, can be part of a circuit outside the device and in which a second carrier fluid can circulate.

Figure 12:
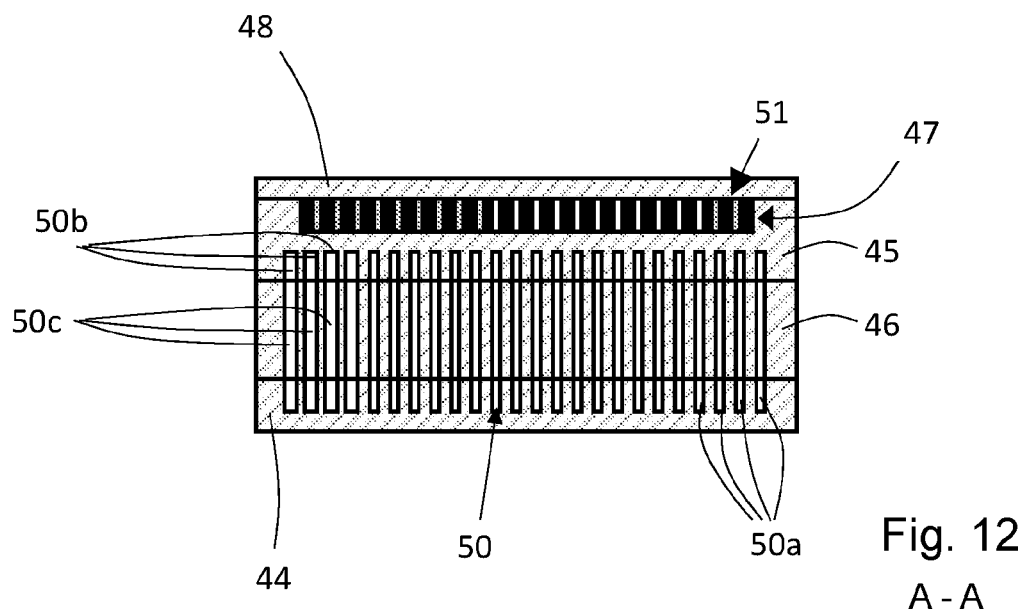
FIG. 12 shows a view according to a side section A-A of FIG. 11.

Going back to the embodiment illustrated in FIG. 12, the condensation portion 7 can further include a closing plate 48 placed to close the plate-like element 45.

Alternative solutions are not excluded wherein the closing plate 48 and the plate-like element 45 are implemented in one single piece.

The structure of pulsating heat-based heat exchange device can include additional heat exchange means like finned elements 51 obtained in the condensation portion 7. The finned elements 51 can subtract heat from the first carrier fluid, by heating up. Consequently, if crossed by a colder second carrier fluid, they can give heat to the latter by acting as exchange surfaces.

Usefully, the finned elements 51 can define the circulation channels, or otherwise called microchannels, configured to be crossed by a second carrier fluid.

In particular, the heat exchange means can include finned elements 51 obtained on at least one between the plate-like element 45 and the closing plate 48.

Preferably, the finned elements 51 can be arranged in the circulation area 47, between the distribution areas 47*a* and 47*b*, so as to define circulation channels, or otherwise called microchannels, in fluid communication with the distribution areas themselves. The second carrier fluid can circulate from the distribution areas 47*a* to the distribution areas 47*b* passing through the channels defined by the finned elements 51 and herein subtracting heat from the first carrier fluid, in particular from the first carrier fluid existing in the portions 50*b*.

The microchannels can be planned so as to optimize both the heat transfer coefficient and the pressure drops of the carrier fluid and to avoid the appearance of stopping bubbles. Usefully, the process for manufacturing microchannels can provide milling and cutting procedures from a starting element with a numerical control machine.

Figure 14:
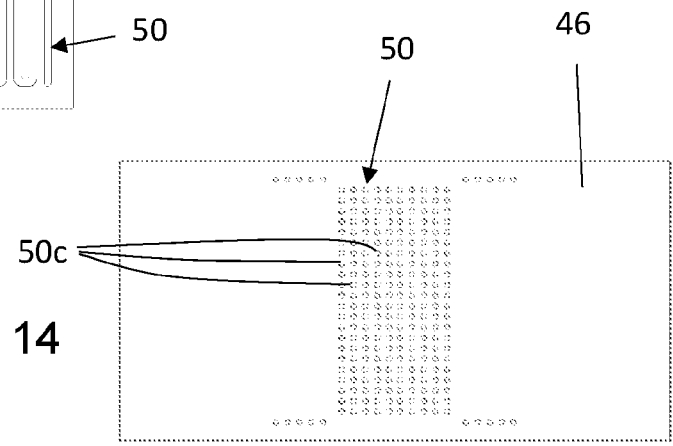
Figure 15:
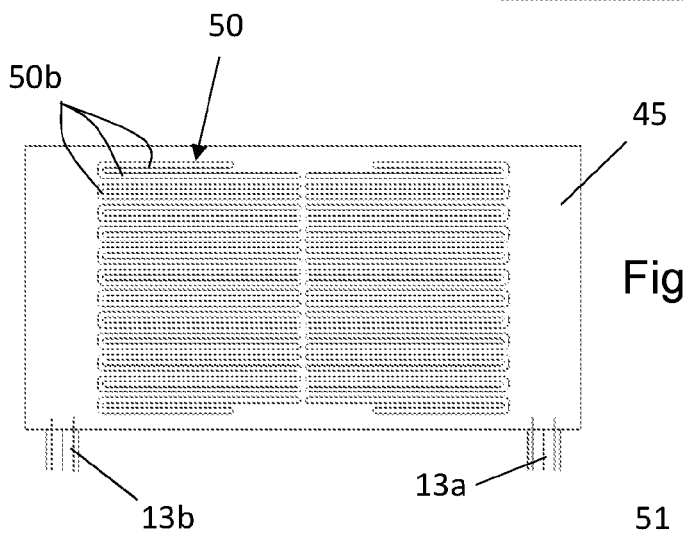

Advantageously, the pulsating heat-based heat exchange device can include an additional plate-like element 46 otherwise called "adiabatic plate". In FIG. 14 a view in horizontal section is illustrated of the adiabatic plate 46.

The adiabatic plate 46 is configured to connect fluidically the evaporation portion 6 to the condensation portion 7.

Figure 11:
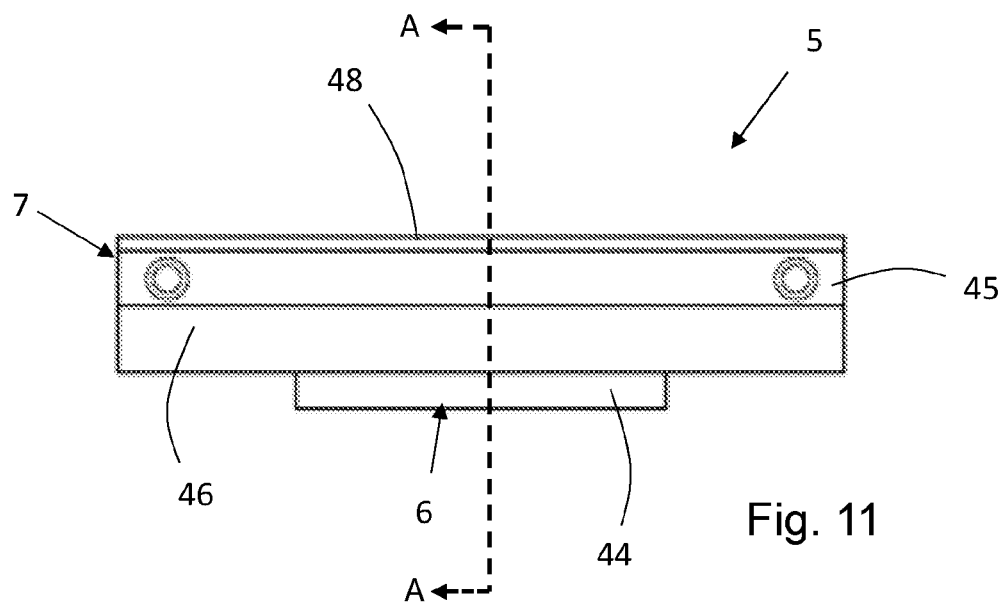
FIG. 11 shows a side view of FIG. 10.

Usefully, the adiabatic plate 46, the evaporation portion 6 and the condensation portion 7 are coupled and overlapped therebetween so as to define a compact body. In particular, as illustrated in FIGS. 11 and 12, the plate-like element 44, the adiabatic plate 46, the plate-like element 45 and the closing plate 48 are coupled so as to define a compact body. This involves structural advantages, since the device results to be more resistant and lasting, but even functional advantages, since the space required to house the device is reduced, a height development not being required.

Preferably, the plate-like elements 44, 45, and the adiabatic plate 46 can be made of copper, since it has a high thermal conductivity, but solutions are not excluded in which they are made of aluminium or other thermally conductive material. Alternative solutions are not excluded, for example wherein the whole device is made of aluminium.

In the adiabatic plate 46 third portions 50*c* of the coil element 50 are inserted. Each portion 50*c* is interposed between a respective first portion 50*a* and a respective second portion 50*b*, and it is placed in fluid communication therewith.

Figure 17:
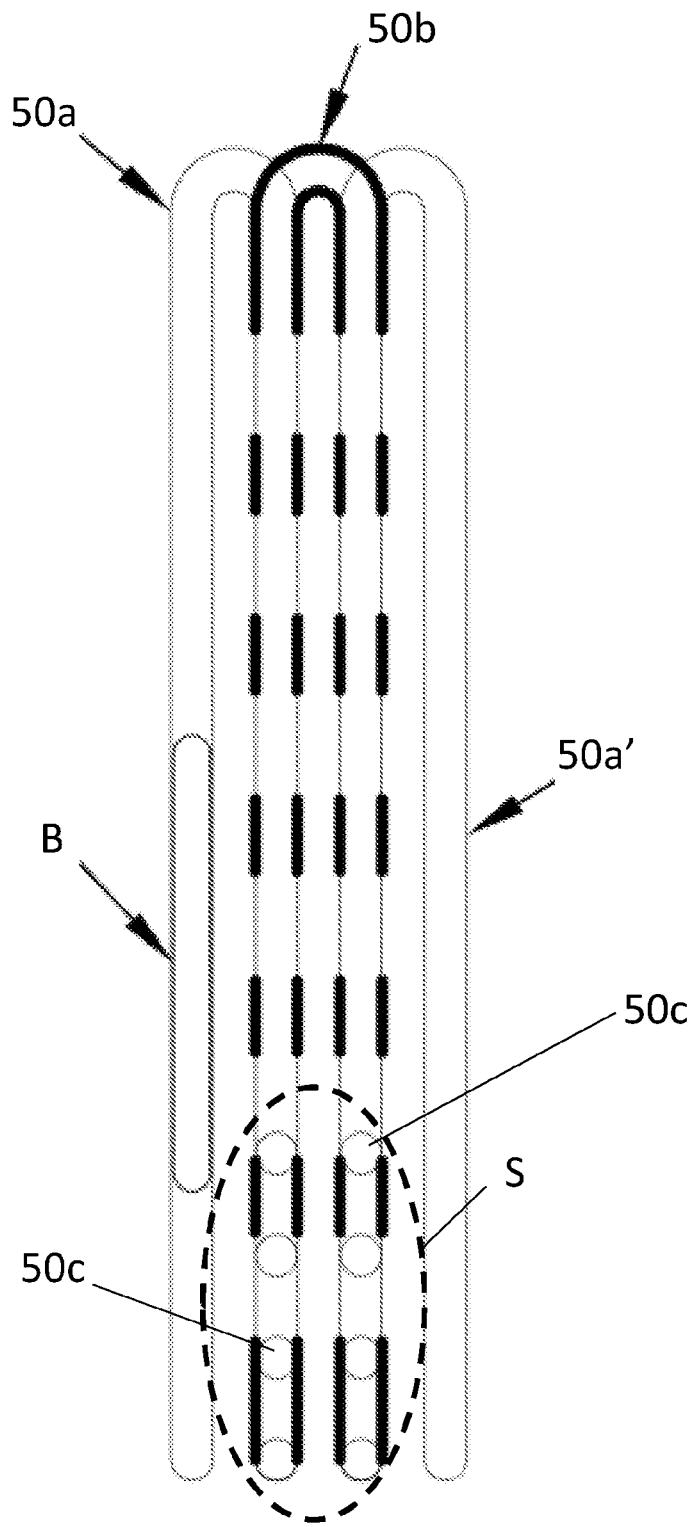
FIG. 17 shows a top schematic view of the fluidic components implemented by the structural detail shown in FIG. 10, according to a preferred embodiment variant.

In particular, with reference to FIG. 17, a schematic view of a portion of the pulsating heat-based heat exchange device 5 is shown with particular reference to the operation principle controlling the circulation of the first thermal carrier fluid.

Specifically, the circulating means 50 is shown through the structure with overlapped portions of evaporation 6 and condensation 7, more in detail in the embodiment with an adiabatic plate 46 interposed between the plate-like elements 44, 45.

It is to be noted that the first portion 50*a* of the circulating means 50, that is the portion associated to the evaporation portion 6, includes a coil in which a vapor bubble B of the first carrier fluid is entrapped.

The heat-generating component 4 is in contact with the evaporation portion 6 and said bubble B expands due to the heat received during the heat exchange therewith.

Preferably, the first portion 50*a* of the circulating means 50 includes canalizations obtained in the evaporation portion 6, in particular in the plate-like element 46. In the herein described embodiment, said canalizations are closed on the top by the adiabatic plate 46.

Said bubble B then is confined between the side walls of the coil 50*a* and its expansion generates a push in axial development direction of the canalizations which constitute the coil itself, by tending to push the first carrier fluid contained therein (be it in liquid phase of vapour phase).

Said bubble B then is obliged to flow axially along the coil 50*a* until it finds the outlet produced by the portions 50*c* of the adiabatic plate 46.

Said portions 50*c* preferably include a plurality of openings distributed in an overlapping region S of the first portion 50*a* with a corresponding second portion 50*b* of the circulating means 50 of to the condensation portion 7.

Such portions 50*c* advantageously allow to convey the first operating fluid from evaporation portion 6, on the top, to the condensation portion 7.

Advantageously, as it can be appreciated from FIGS. 13, 15-17, the canalizations 50*b* of the condensation portion 7 develop in a parallel plane arranged above the plane in which the canalizations 50*a* of the evaporation portion 6 develop.

In particular, with reference to FIG. 17, the canalizations 50*a* and 50*b* result to be mutually staggered so that the third portions 50*c* can put in fluid communication at least a canalization 50*b* of the condensation portion 7 with two distinct canalizations 50*a*, 50*a*' of the evaporation portion 6 at said overlapping region S.

In this way, the vapour of the first carrier fluid which recondenses in the canalizations 50*b* of the condensation portion 7 can fall again in the openings 50*c* which are in communication with a second distinct canalization 50*a*' of the evaporation portion 6 with respect to the first canalization 50*a* therefrom it has arrived.

It will be then appreciated that the circulating means 50 of the evaporation portion 6 and condensation portion 7 are placed in series and alternatively therebetween, by implementing in fact one single capillary tube in a structure with overlapped plates.

Advantageously, said solution with plate-like elements implements a primary circuit 5 through a much more compact pulsating heat-based heat exchange device than the known solutions of the type with capillary tubes.

In this sense, such solutions can be further proposed as heat spreader, for very powerful electronic devices, or devices with several electronic units or powers even very different therebetween.

Moreover, a structure with overlapped plate-like elements allows to implement during planning a primary circuit 5 with variable width canalizations in order to optimize the heat exchanges. In this way one guarantees to the fluid a preferential directionality and thus a more effective heat exchange.

It is also possible to obtain in the same plate-like element canalizations with different length, by making this solution particularly suitable for implementations which provide several heat-generating components 4 in scattered distribution.

Still, apart from the thickness and to the length of the circulating means 50, it is advantageously possible acting on the number and arrangement of the openings 50*c* of the adiabatic plate 46. With respect to the pulsating heat-based heat exchange devices with capillary tube of known type, the proposed solution then offers a greater flexibility in the planning phase.

According to advantageous embodiments, is it namely possible to have available a number and arrangement of the openings 50c depending upon the application type.

Generally, a greater number of openings 50c, with wide distribution on the adiabatic plate 46 is to be preferred for medium-low dissipation powers. In fact, for these powers the vapour bubbles B are shorter but more numerous, then they have to reach the condensation portion 7 as soon as possible.

Differently, for high powers, it is preferable to implement openings 50c concentrated at the ends of the canalizations 50a, 50b, for example in a "U"-like tract of its own axial development direction, so as to obtain the maximum expansion push.

Moreover, different development geometries of the circulating means 50 can be provided with respect to those illustrated in FIGS. 13, 15-17.

Advantageously, the presence of the adiabatic plate 46 and of the openings 50c carried thereby, allows to implement canalizations 50a, 50a' of the evaporation portion 6 in fluid communication with several canalizations 50b of the condensation portion 7, for example four or more distinct canalizations, by obtaining in the respective plates suitable oriented paths, for example ring-like or petal-like paths.

Moreover, alternative embodiments are not excluded, wherein the pulsating heat pipe has a different shape than the one described above, for example of tubular type.

A cooling method for electronic heat-generating means can provide a heat exchange between a heat-generating means and a first biphasic carrier fluid having a pulsating oscillatory motion. In particular, the heat exchange can take place by means of a device as previously described.

The device is particularly useful to cool down heat-generating means existing in the servers 1U, since they have a reduced height with respect to the servers 2U, 4U, or other new types of servers, the second embodiment being adaptable to different shapes and different orientations.

An advantage linked to this second embodiment relates to the different paths which the biphasic flow can take through the holes of the adiabatic plate 46. The holes define different lengths in the evaporation portion 6 and in the condensation portion 7, so that the fluid selects the best holes therethrough it can flow depending upon the resistance to the flow and to the thermal load. Moreover, the path defined by the coil element 50 in the evaporation portion 6 and in the condensation portion 7 defines U-like inversions for the pulsating motion, by adding several pulsating modes to the flow.

The second embodiment of the system 1, moreover, is compatible with the previously described apparatus 20.

The first embodiment and second embodiment as previously described can be used in combination therebetween, for example in case of racks having different types of servers (1U, 2U, etc.). In this case a user can apply a cooling system wherein both the first thermosyphon circuits are present as described in the first embodiment (mini-thermosyphon), and second thermosyphon circuits as described in the second embodiment (pulsating heat pipe), by selecting the solution which suits at best to the configuration of the rack to be cooled down.

Additional Features of the Cooling System 1

Advantageously, the system 1 can include connector means configured to implement and/or interrupt a physical and/or thermal coupling between the second thermosyphon circuits 8 and the single delivery conduit 15 and/or the single return conduit 16.

The connector means can be quick-fit connectors interposed between a second thermosyphon circuit and the delivery conduit 15 or the return conduit 16. Such connectors allow to connect/disconnect easily the second circuit from the remaining architecture, without interrupting the fluid circulation in the other second circuits 8.

Such feature is particularly useful in case a maintenance or replacement of a server 2 is required, since it results possible to disconnect the server and the circuits associated thereto without interrupting the fluid circulation in the remaining circuits.

The connectors are configured to interrupt the flow line so that the fluid does not flow inside the evaporator of the second thermosyphon circuit 8 in case it is necessary to remove a server from the rack. Thanks to this, it is possible to avoid a flow bypass. A flow by-pass generally has to be avoided to prevent the instability of the flow itself, which is a common problem in the circuits with traditional thermosyphons and in the circuits with thermosyphons with by-pass between the liquid main line and the vapour main line.

Usefully, the quick-fit connectors can be constituted by a male body and a female body, not illustrated in the drawings which, when they are coupled, allow the fluid transit. Both the male body and the female body can be equipped with spring devices configured to close respective circuit portions when the two bodies are disconnected. In both positions, then, the working fluid is not dispersed in the environment.

Alternative solutions are not excluded wherein the connectors have different configurations or wherein the connector means is other connectors known to the state or art, but different from the above-described ones.

With reference to FIG. 8, advantageously, the system 1 can include phase separation means 17, 18 configured to separate a gaseous portion of the second thermal carrier fluid inletting said return conduit 16 from a substantially liquid portion of the same second carrier fluid.

In this way it is possible to control the gaseous and liquid fractions with the purpose of optimizing the heat exchange yields without incurring in pressure drops which could cause malfunctions. On this regard, it is to be noted that the fact of having a liquid-vapour mixture flowing inside the return conduit 16 can be cause of a significant pressure drop in the return conduit itself, then reducing the mass range of the carrier fluid. In fact, the liquid phase in the return conduit 16 reduces the density difference between the flows in the return 16 and delivery 15 conduits, and it has a higher viscosity than the vapour phase.

in order to avoid the early drying of the biphasic flow inside the connecting means 13, one prefers to have a low quality of vapour at the outlet of the same second circuits. In fact, the fact of having the fluid partially liquid until it outgoes from the connecting means 13 allows higher values of the heat transfer coefficient.

According to a preferred embodiment illustrated schematically in FIG. 8, the phase separation means 17, 18 comprises a separating cylinder 17 interposed in fluid communication between said return conduit 16 and said second thermosyphon circuit 8.

The separating cylinder 17 is communicating on the top with the return conduit 16. The separating cylinder 17 can have a section with larger diameter than the section of the second thermosyphon circuit 8. In this way, the second carrier fluid entering the separating cylinder 17 is subjected to a pressure drop which allows the gaseous portion to continue upwardly in the return conduit 16, whereas the liquid portion goes down onto the bottom of the cylinder itself.

The phase separation means 17, 18 can further include a recirculation conduit 18 communicating with the separating cylinder 17 and with the delivery conduit 15. The recirculation conduit is configured to convey the liquid portion in the delivery conduit 15.

Usefully, the recirculation conduit 18 is connected to the separating cylinder 17 at the bottom of the latter and it develops with a tilting descending towards the delivery conduit 15.

In this way, the liquid portion accumulated in the bottom of the separating cylinder 17 can be conveyed by gravity in the delivery conduit 15 and re-used.

Figure 7:
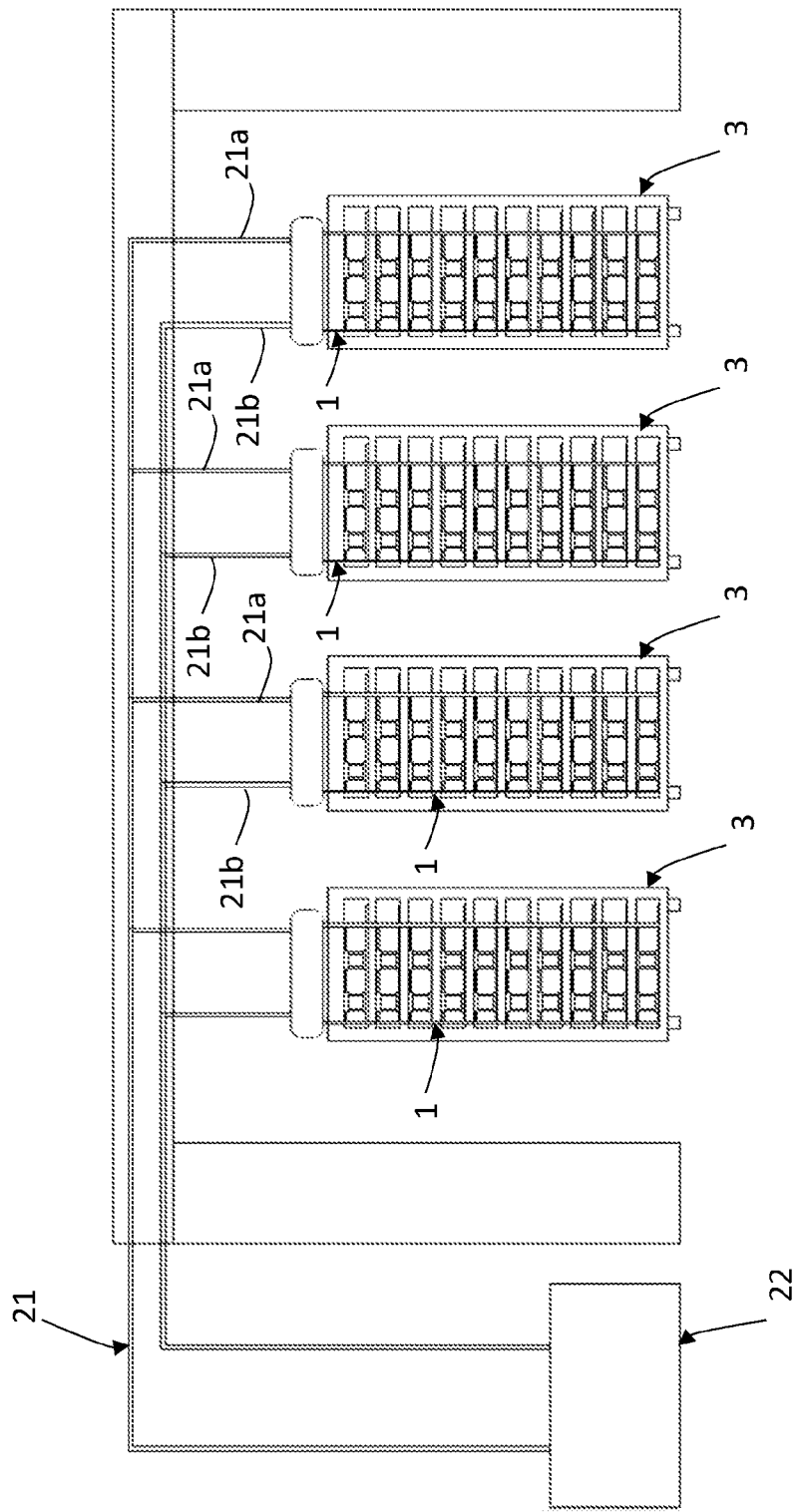
FIG. 7 shows a side section schematic view of an apparatus comprising a plurality of cooling systems according to a preferred embodiment of the present invention.

The present invention further provides a cooling apparatus 20 for a data centre having a plurality of racks 3. An embodiment of the apparatus 20 is schematically illustrated in FIG. 7.

The apparatus 20 can include one or more systems 1, as previously described, for each rack 3. With reference to FIG. 7, the apparatus 20 includes four systems 1, each one thereof, in turn, is associated to a respective rack 3. Apparatuses 20 comprising a different number of systems 1 are not excluded.

Advantageously, the apparatus 20 includes at least a third cooling circuit 21 di thermally coupled to the systems 1, configured to allow circulation of a third thermal carrier fluid.

The third carrier fluid is suitable for exchanging heat with the second thermal carrier fluid circulating in each one of the systems 1. The third carrier fluid can subtract heat from the second carrier fluid, consequently by cooling the rack 3.

Usefully, the third circuit 21 can be provided with the delivery sides 21a and return sides 21b communicating with the condensation units 14 of each system 1.

In particular, the third carrier fluid is conveyed through the delivery sides 21a in each one of the condensation units 14. Here, the third fluid heats up by subtracting heat from the second carrier fluid and it is conveyed, through the return sides 21b, exiting from the condensation units 14.

With reference to FIG. 7, the delivery sides 21a are fed parallelly, but solutions are not excluded providing an in-series or mixed in series-parallel power supply between the same delivery sides.

Even the return sides 21b are fed parallelly, but solutions are not excluded providing an in-series or mixed in series-parallel power supply between the same return sides.

Advantageously, the apparatus 20 can include at least a cooling unit 22 associated to the third circuit 21 and configured to subtract heat from the third carrier fluid, by cooling it.

Preferably, the cooling unit 22 can be of the type of a refrigerating group or chiller. The chiller can work at a higher evaporation temperature than the traditional cooling systems, by increasing the COP. The increase in the evaporation temperature can remove the need for expensive cooling towers which require much maintenance.

Alternative embodiments are not excluded wherein the cooling unit 22 is not present. For example, the heat carrier fluid exchanging heat with the second thermosyphon circuit 8 can throw the heat directly in the air outside the data centre, with a finned battery. Alternatively, said heat carrier fluid, since it can work at temperatures comprised between 40° C. and 60° C., can be used for other purposes, such as heating of environments or generation of electrical energy.

The apparatus 20, then, thanks to the system 1, results to be easy to be built, with easy maintenance.

Moreover, the apparatus 20, if suitably configured, allows to extend the principle of the thermosyphon even to the third circuit 21.

In this case the third carrier fluid would be of the type of a thermal carrier fluid analogous to the previously described first and second fluid and the motion inside the third circuit 21 would be fed by the phase changes which would be required at each system 1.

The present invention has been so far described with reference to preferred embodiments. It is to be meant that other embodiments belonging to the same inventive core may exist, as defined by the protective scope of the here below reported claims.

The invention claimed is:

1. A cooling system for data centre, which data centre includes a plurality of servers associated to form a rack, each server being provided with heat-generating means, said system comprising:
   a primary circuit, for each server, configured to allow circulation of a first thermal carrier fluid suitable for exchanging heat with said heat-generating means, wherein said primary circuit includes a heat exchange region coupled with said heat-generating means,
   a plurality of second thermosyphon circuits each one associated to a respective server of said plurality and coupled to a respective primary circuit at said heat exchange region, said plurality of second thermosyphon circuits being configured to allow circulation of a second thermal carrier fluid suitable for exchanging heat with said first thermal carrier fluid,
   wherein each primary circuit includes a device comprising an evaporation portion placed thermally in contact with said heat-generating means and a condensation portion, said condensation portion being overlapped to said evaporation portion and placed thermally in contact with a respective second thermosyphon circuit of said plurality,
the overall configuration of the system being such that said plurality of second thermosyphon circuits are in fluid communication with each other according to a parallel connection.

2. The cooling system according to claim 1, wherein said plurality of second thermosyphon circuits are in communication with each other through a single delivery conduit and a single return conduit.

3. The system according to claim 1, wherein said device includes heat exchange means associated to said evaporation portion and to said condensation portion configured to allow said first carrier fluid to exchange heat.

4. The system according to claim 3, wherein said heat exchange means comprises a plurality of finned elements defining crossing channels for the first and/or the second thermal carrier fluid.

5. The system according to claim 1, wherein said primary circuit includes a thermosyphon circuit.

6. The system according to claim 1, wherein said primary circuit includes a pulsating heat-based heat exchange device.

7. The system according to claim 6, wherein said pulsating heat-based heat exchange device includes an evaporation portion and a condensation portion coupled and overlapped therebetween to form a single monolithic body.

8. The system according to claim 6, wherein said pulsating heat-based heat exchange device includes a coil element wherein said first carrier fluid flows, said coil element being obtained in said evaporation portion and said condensation portion.

9. The system according to claim 6, wherein said coil element includes first portions positioned at the evaporation portion and second portions positioned at the condensation portion, said first portions and said second portions being placed in fluid communication therebetween.

10. The system according to claim 6, wherein said coil element has a cross section having an equivalent diameter lower than 2 mm.

11. The system according to claim 7, comprising an adiabatic plate interposed between said evaporation portion and said condensation portion.

12. The system according to claim 11, wherein said adiabatic plate includes a plurality of openings distributed in an overlapping region (S) of said first portions with corresponding said second portions.

13. The system according to claim 1, wherein said plurality of second thermosyphon circuits includes connecting means configured to implement a thermal coupling in series and/or in parallel with a respective primary circuit.

14. The system according to claim 2, further comprising at least a recirculation conduit configured to implement a fluid communication between said single delivery conduit and said single return conduit.

15. The system according to claim 2, further comprising connector means configured to implement and/or interrupt a physical and/or thermal coupling between said plurality of second thermosyphon circuits with said single delivery conduit and/or said single return conduit.

16. A cooling apparatus for a data centre having a plurality of server racks, which apparatus comprises:
    a cooling system according to claim 1 for each server rack of said plurality;
    at least a third cooling circuit thermally coupled with said cooling system and configured to allow circulation of a third thermal carrier fluid suitable for exchanging heat with said second thermal carrier fluid.

17. The apparatus according to claim 16, comprising at least a cooling unit associated to said third cooling circuit and configured to subtract heat from the third thermal carrier fluid.

18. The system according to claim 10, wherein said coil element has a cross section having an equivalent diameter between 0.5 mm and 1 mm.

* * * * *